United States Patent [19]

Lafon et al.

[11] Patent Number: 5,118,659
[45] Date of Patent: Jun. 2, 1992

[54] PRODUCTION OF SUPERCONDUCTOR MATERIALS USING A HELICOIDAL FLOW OF HOT GASES TO EFFECT PULVERIZATION AND DRYING

[75] Inventors: Marie-Odile Lafon; Claude Magnier, both of Paris, France

[73] Assignee: Rhone-Poulenc Chimie, Courbevoie, France

[21] Appl. No.: 536,944

[22] Filed: Jun. 12, 1990

Related U.S. Application Data

[63] Continuation of Ser. No. 245,903, Sep. 19, 1988, abandoned.

[30] Foreign Application Priority Data

Sep. 18, 1987 [FR] France ................. 87 12934

[51] Int. Cl.$^5$ ................. H01L 39/12; B29B 9/00
[52] U.S. Cl. ................. 505/1; 505/778; 505/780; 505/781; 264/8; 264/12; 501/152
[58] Field of Search ................. 505/1, 778, 780, 781; 264/8, 12; 501/152

[56] References Cited

U.S. PATENT DOCUMENTS

| | | | |
|---|---|---|---|
| 4,263,234 | 4/1981 | Prudhon et al. | 261/153 |
| 4,863,521 | 9/1989 | Block | 505/1 |
| 4,898,851 | 3/1990 | Michel | 505/809 |
| 4,956,340 | 9/1990 | Kimura et al. | 505/1 |

FOREIGN PATENT DOCUMENTS 0122665 10/1984 European Pat. Off. .
2017523 10/1979 United Kingdom .

OTHER PUBLICATIONS

Wakata et al., Proceedings of the 18th Int. Conf. on Low Temp Physics, pp. 1059-1060 (1987).
Perry et al., *Chemical Engineer's Handbook*, (McGraw-Hill, N.Y.) 1963, pp. 20-57-20-61.
Increased Transition Temperatures in $YBa_2Cu_3O_y$ Superconducting Ceramics by Exposure to Nitrogen, D. N. Matthews et al., Nature, vol. 328, Aug. 1987.
Advanced Ceramic Materials-Ceramic Superconductors, G. W. Crabtree et al., vol. 2, No. 3B, Jul. 1987.

*Primary Examiner*—Michael Lusignan
*Assistant Examiner*—Benjamin L. Utech
*Attorney, Agent, or Firm*—Burns, Doane, Swecker & Mathis

[57] ABSTRACT

Finely divided, homogeneous and easily sintered superconducting powders of at least one rare earth element, e.g., yttrium and/or lanthanum, at least one alkaline earth metal, e.g., barium, calcium and/or strontium, and at least one transition metal, e.g., copper, nickel, manganese, cobalt and/or iron, and oxygen, are produced by (a) solubilizing, in water, the nitrates and/or acetates of at least one rare earth element, at least one alkaline earth metal, and at least one transition metal; (b) atomizing such solution to dryness; (c) calcining the dried product; and, optionally; (d) grinding the calcined material.

19 Claims, No Drawings

PRODUCTION OF SUPERCONDUCTOR MATERIALS USING A HELICOIDAL FLOW OF HOT GASES TO EFFECT PULVERIZATION AND DRYING

This application is a continuation of application Ser. No. 07/245,903, filed Sept. 19, 1988, now abandoned.

CROSS-REFERENCE TO COMPANION APPLICATIONS

Our copending applications, Ser. No. 245,902, now U.S. Pat. No. 5,071,827 and Ser. No. 245,901, abandoned, both filed concurrently herewith and both assigned to the assignee hereof.

BACKGROUND OF THE INVENTION

1. Field of the Invention

The present invention relates to the production of superconductor materials.

2. Description of the Prior Art

It is known to this art that, in theory, when superconductors are cooled to very low temperatures, they offer no resistance to the flow of an electric current.

Until somewhat recently, the state of superconductivity was observed only in certain materials below a threshold temperature, designated the "critical temperature", such threshold typically approximating absolute zero. This type of limitation obviously presents a serious drawback in the large scale development of any potential practical application resulting from superconductivity.

Very recently, however, research has given rise to the development of new materials having superconducting properties at higher temperatures, i.e., temperatures on the order of from 70° to 90° K., or even as high as 100° K.

These materials are principally based on the rare earths, alkaline earths, transition metals and oxygen. More specifically, the most promising systems studied appear to be those based on yttrium and/or lanthanum, barium and/or strontium and/or calcium, copper and/or nickel and/or cobalt and/or manganese, and oxygen.

The mode of synthesis generally described in the literature for producing such materials entails a solid phase reaction at elevated temperatures (1,000° C.) between oxides and/or salts containing a volatile anion (for example, the carbonate) of the corresponding elements, with the latter compounds being present in the form of powders.

However, this process has the disadvantage of requiring delicate controls and the powders constituting the final product are largely inadequate in terms of their sinterability.

But, relative to certain practical applications, only the use of sintered superconducting products is of any real interest.

Therefore, it is essential that dense and homogeneous sintered materials be available which retain the intrinsic superconducting characteristics of the initial powders. Consequently, it is necessary to first have homogeneous superconducting powders that are readily and easily sintered.

SUMMARY OF THE INVENTION

Accordingly, a major object of the present invention is the provision of a simple, effective and readily applicable improved process for the reproducible production of homogeneous superconducting powders displaying excellent sintering properties, as well as for the production of high density sintered superconducting materials therefrom.

Briefly, the present invention features a process for the production of finely divided superconducting and sinterable powders, comprising:

(a) preparing an aqueous solution based on the nitrates and/or acetates of at least one rare earth element, at least one alkaline earth metal and at least one transition metal;

(b) drying said solution by atomization;

(c) calcining the dried product; and, optionally;

(d) grinding the calcined material.

DETAILED DESCRIPTION OF THE PREFERRED EMBODIMENTS OF THE INVENTION

More particularly according to the present invention, the term "rare earth element" is intended to connote any element of the Periodic Table having an atomic number of from 57 to 71, as well as yttrium.

The rare earths particularly preferred in the process according to the invention are yttrium and lanthanum.

The principal alkaline earth metals suitable for use according to the invention are calcium, barium and strontium.

Finally, the transition metals are advantageously selected from among copper, nickel, manganese, cobalt and iron.

The selection of the particular elements from among those mentioned above will be a function of the nature and composition of the superconducting powder to be produced.

Similarly, the proportions of the different starting materials in the initial solution are adjusted in conventional manner as a function of the stoichiometry desired in the final product, which obviously should correlate with the ultimate realization of superconducting properties.

The process according to the invention is thus particularly applicable to the preparation of superconducting systems of the Y—Ba—Cu—O type. These systems were studied, in particular, in the *Journal of the American Chemical Society*, 109, 2528–2530 (1987).

In accordance with this invention, the rare earth element, the alkaline earth metal and the transition metal are present in the initial aqueous solution in the form of the nitrates or acetates thereof, or as a mixture of these two salts. Preferably, however, a solution of nitrates is used.

This stage of preparation is followed by the drying of the solution.

According to the invention, this drying is carried out by atomization, i.e., by pulverizing the solution in a hot atmosphere. The atomization may be effected by means of any known pulverizer, for example by a pulverizing nozzle of the sprinkling rose type, or any other type. Relative to the different pulverizing methods suitable for use in the subject process, compare the text by Masters entitled *SPRAY DRYING* (Second Edition, George Godwin Publisher, London (1976)).

However, the drying process is preferably conducted in a "flash" reactor, for example of the type developed by the assignee hereof and described specifically in FR 2,257,326, 2,419,754 and 2,431,321. In this case, the treatment gases flow helically and define a vortex. The solution is injected in a path coinciding with the axis of symmetry of the helicoidal paths of the gases, which makes it possible to transfer perfectly the momentum of the gases to said solution. The gases thus perform a dual function: on the one hand, that of the pulverization, i.e., the transformation of the solution into fine droplets, and on the other, the drying of the resulting droplets. Furthermore, the retention time of the particles in the reactor is extremely short, less than approximately 1/10 of a second, which eliminates any risk of overheating due to an overly lengthy contact with the gases.

Depending on the respective flow rates of the gases and the solution, the inlet temperature of the gases ranges from 600° to 900° C., preferably from 700° to 900° C., and the outlet temperature of the dried solids ranges from 100° to 300° C., preferably from 150° to 250° C.

A dry product having a grain size distribution on the order of a few microns, for example from 1 to 10 microns, is thus produced.

The product is then calcined.

The calcination is carried out at a temperature of from 700° to 1,000° C., preferably from 850° to 950° C. The duration of the calcination may vary from 30 min to 24 h, for example, and preferably from 5 to 15 h.

This calcination is carried out under an atmosphere of air, or any mixture of air and oxygen, but preferably in air.

In a preferred embodiment of the invention, the calcined materials are cooled very rapidly to ambient temperature, which is equivalent to quenching, for example by a stream of cold air.

The cooling time is generally on the order of a few seconds.

Following this calcination, a superconducting powder having a macroscopic grain size distribution of approximately 1 to 10 microns is obtained, with the 1 to 10 micron grains consisting of elementary crystals of a size of from about 100 Å to 600 Å.

The powders obtained must be ground, preferably dry, such as to enable good and effective sintering. The mean grain size distribution of the powders then ranges from about 0.5 to 2 microns, preferably from 1 to 2 microns.

The resulting superconducting powders have the notable property of ready conversion, after sintering, into perfectly homogeneous sintered superconducting materials, having a density higher than 95% of the theoretical density of the material under consideration.

The sintering temperature of the powders ranges from 900° to 1,000° C. and the sintering time generally ranges from 2 to 10 h. The sintering is preferably carried out under an oxygen atmosphere.

More specifically, the characteristics of the superconducting powders according to the invention relative to their sinterability, are determined as follows:

The powder is first pelleted with or without a binder, under a uniaxial pressure of 1.5 T/cm$^2$, then sintered for 2 h at a temperature of 950° C. and cooled for 7 h to ambient temperature; the density of the product obtained is then measured. In all cases, a final density higher than 95% of the theoretical density of the material under consideration is obtained.

It is further observed that the sintered material has very good superconducting properties.

In order to further illustrate the present invention and the advantages thereof, the following specific example is given, it being understood that same are intended only as illustrative and in nowise limitative.

EXAMPLE

This example illustrates the preparation of a superconducting material of the formula Y—Ba$_2$—Cu$_3$—O$_x$ ($6.5 \leq X \leq 7$) according to the invention.

(A) Preparation of the Powder

Into 11.5 l water at 70° C., 1.5 moles of yttrium nitrate, 3 moles of barium nitrate and 4.5 moles of copper nitrate were introduced.

After homogenization, the resulting solution was dried by atomization.

Drying was carried out in a "flash" type reactor described in FR 2,257,326, 2,419,754 and 2,431,321.

The inlet temperature of the gases was 800° C. and their outlet temperature 250° C.

The powder obtained after drying was then calcined at 900° C. in air, for a time of from 10 to 15 h, and subsequently rapidly cooled to ambient temperature.

Dry grinding of the powder was then carried out, until a powder having a grain size distribution of less than 2 microns was obtained.

The characteristics of the resulting powder were the following:

(i) Specific (BET) surface: 2.2 m$^2$/g
(ii) Total pore volume: 0.39 cm$^3$/g
(iii) Actual pore volume: 0.28 cm$^3$/g
(iv) Intergranular volume: 0.11 cm$^3$/g
(v) Pore size: 0.1–3 micron
(vi) Mean pore diameter: 0.9 micron
(vii) Mean grain size: 1.7 micron
(vii) Mean crystallite size: approx. 300 Å

The grain size distribution of the grains was the following ($\phi$ = diameter):

$\phi > 4$ micron: 10%
0.7 micron $< \phi <$ 4 micron: 80%
$\phi < 0.7$ micron 10%

(B) Sintering of the Powder

The powder was pelleted by dry, uniaxial pressing under a pressure of 1.5 T/cm$^2$, then sintered at 950° C. for 2 h under oxygen and then cooled for 7 h to ambient temperature.

A material having a density equal to 96% of the theoretical density was obtained.

The material was superconducting. Its temperature of "onset" of transition was 92° K. and it had the average formula of Y—Ba$_2$—CU$_3$—O$_{6.9}$.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. A process for the production of a finely divided superconducting powder of rare earth element, at least one alkaline earth metal, at least one transition metal, and oxygen, comprising (a) solubilizing, in water, the nitrates and/or acetates of at least one rare earth element, at least one alkaline earth metal, and at least one transition metal; (b) atomizing such solution to dryness comprising injecting such solution into the axis of symmetry of a helicoidal flow of hot gases to establish a vortex, whereby effecting pulverization and drying, with the retention time of the particulates in such reaction zone being less than about 1/10 sec; and (c) calcining the dried product.

2. The process as defined by claim 1, wherein the inlet temperature of said hot gases ranges from 600° to 900° C.

3. The process as defined by claim 2, wherein said inlet temperature ranges from 700° to 900° C.

4. The process as defined by claim 2, wherein the outlet temperature of the dried solids ranges from 100° to 300° C.

5. The process as defined by claim 4, wherein said outlet temperature ranges from 150° to 250° C.

6. The process as defined by claim 1, wherein said calcination is carried out at a temperature of from 700° to 1,000° C.

7. The process as defined by claim 6, said calcination temperature ranging from 850° C. to 900° C.

8. The process as defined by claim 1, comprising conducting said calcination in air.

9. The process as defined by claim 1, comprising very rapidly cooling said calcined product to ambient temperature.

10. The process as defined by claim 1, comprising solubilizing the nitrates of said at least one rare earth element, at least one alkaline earth metal, and at least one transition metal.

11. The process as defined by claim 10, comprising solubilizing the nitrates of yttrium, barium and copper.

12. The process as defined by claim 1, said at least one rare earth element comprising yttrium or lanthanum.

13. The process as defined by claim 1, said at least one alkaline earth metal comprising calcium, barium or strontium.

14. The process as defined by claim 1, said at least one transition metal comprising copper, nickel, manganese, cobalt or iron.

15. A finely divided, homogeneous and easily sintered superconducting powder comprising the product of the process as defined by claim 1.

16. The process as defined by claim 1, wherein the calcining of the dried product of (c) follows directly after the atomization of the solution of (b).

17. The process as defined by claim 1, wherein said process further comprises (d) grinding said calcined product.

18. The process as defined by claim 17, comprising grinding under dry conditions.

19. The process as defined by claim 18, wherein said grinding is to such extent as to reduce the particle size of the calcined product to a mean grain size distribution of less than 2 microns.

* * * * *